(12) United States Patent
Preuss et al.

(10) Patent No.: US 8,722,322 B2
(45) Date of Patent: May 13, 2014

(54) PHOTONIC HEATING OF SILVER GRIDS

(75) Inventors: Donald R. Preuss, Rochester, NY (US); Mitchell S. Burberry, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 136 days.

(21) Appl. No.: 13/362,297

(22) Filed: Jan. 31, 2012

(65) Prior Publication Data
US 2013/0196269 A1  Aug. 1, 2013

(51) Int. Cl.
G03F 7/00 (2006.01)
G03F 1/00 (2012.01)

(52) U.S. Cl.
USPC ............ 430/330; 430/13; 430/264; 430/269; 430/494; 430/617; 430/219

(58) Field of Classification Search
USPC ............ 430/11, 13, 258, 264, 330, 331, 269, 430/617, 619, 319, 494
See application file for complete search history.

(56) References Cited

U.S. PATENT DOCUMENTS

| | | |
|---|---|---|
| 3,223,525 A | 12/1965 | Hendrik |
| 3,622,318 A | 11/1971 | Evans |
| 4,269,927 A | 5/1981 | Atwell |
| 4,400,463 A | 8/1983 | Maskasky |
| 4,414,306 A | 11/1983 | Wey et al. |
| 4,713,323 A | 12/1987 | Maskasky |
| 4,783,398 A | 11/1988 | Takada et al. |
| 4,804,621 A | 2/1989 | Tufano et al. |
| 4,820,624 A | 4/1989 | Hasebe et al. |
| 4,952,491 A | 8/1990 | Nishikawa et al. |
| 4,983,508 A | 1/1991 | Ishiguro et al. |
| 5,264,337 A | 11/1993 | Maskasky |
| 5,275,930 A | 1/1994 | Maskasky |
| 5,320,938 A | 6/1994 | House et al. |
| 5,385,817 A | 1/1995 | Bell |
| 5,512,415 A | 4/1996 | Dale et al. |
| 5,550,013 A | 8/1996 | Chen et al. |
| 5,589,318 A | 12/1996 | Dale et al. |
| 5,726,005 A | 3/1998 | Chen et al. |
| 5,736,310 A | 4/1998 | Chen et al. |
| 6,573,021 B2 | 6/2003 | Baker et al. |
| 7,351,523 B2 | 4/2008 | Grzeskowiak |
| 2009/0181183 A1 * | 7/2009 | Li et al. .............. 427/553 |
| 2011/0061908 A1 * | 3/2011 | Goto et al. ............ 174/257 |

OTHER PUBLICATIONS

Research Disclosure 36544, Sep. 1994.

* cited by examiner

Primary Examiner — Thorl Chea
(74) Attorney, Agent, or Firm — Nelson Adrian Blish

(57) ABSTRACT

A method of improving conductivity of a metal pattern (18) includes providing a developed silver pattern (14) formed from a photographic silver salt provided in a binder coated on a substrate (12); and selectively heating the silver pattern with electromagnetic radiation.

13 Claims, 3 Drawing Sheets

PHOTONIC HEATING OF SILVER GRIDS

CROSS REFERENCE TO RELATED APPLICATIONS

Reference is made to commonly-assigned copending U.S. patent application Ser. No. 13/362,324 (now U.S. Publication No. 2013/0193136), filed Jan. 31, 2012, entitled PHOTONIC HEATING OF SILVER GRIDS, by Preuss et al.; the disclosure of which is incorporated herein.

FIELD OF THE INVENTION

The present invention relates in general to making touchscreens for computers and smartphones, and in particular to reducing the resistance of a screen use for capacitive touchscreens.

BACKGROUND OF THE INVENTION

Touchscreens are used for interfaces for electronic displays that can detect the location of an object which touches the display area. The object that touches the display surface is usually a finger, but other objects such as a stylus may be used. Touchscreens are found in laptop computers, tablet computers, and smartphones. The touchscreen eliminates the need for a pointer and in some cases, eliminates the need for a keyboard.

Touchscreens require a two-dimensional film with relatively high transparency and high conductivity. Methods of making touchscreens include providing a layer of Indium Tin Oxide (ITO) or alternatively a grid of thin metal traces. Both processes have drawbacks associated with them including high cost. ITO touchscreens, for example, are not conductive enough and require extensive electronics for large displays. The thin metal traces used in making a grid are typically patterned lithographically, which is slow and expensive.

It is desirable to provide a conductive grid with high transparency that is suitable for use in capacitive touchscreens. The grid lines should be sufficiently narrow so that they are not visible under normal viewing conditions. It is also desirable to provide a grid that does not require lithographic printing and is highly conductive.

SUMMARY OF THE INVENTION

Briefly, according to one aspect of the present invention a method of improving conductivity of a metal pattern includes providing a developed silver pattern formed from a photographic silver salt provided in a binder coated on a substrate; and selectively heating the silver pattern with electromagnetic radiation.

The invention and its objects and advantages will become more apparent in the detailed description of the preferred embodiment presented below.

DETAILED DESCRIPTION OF THE INVENTION

Figure 1:
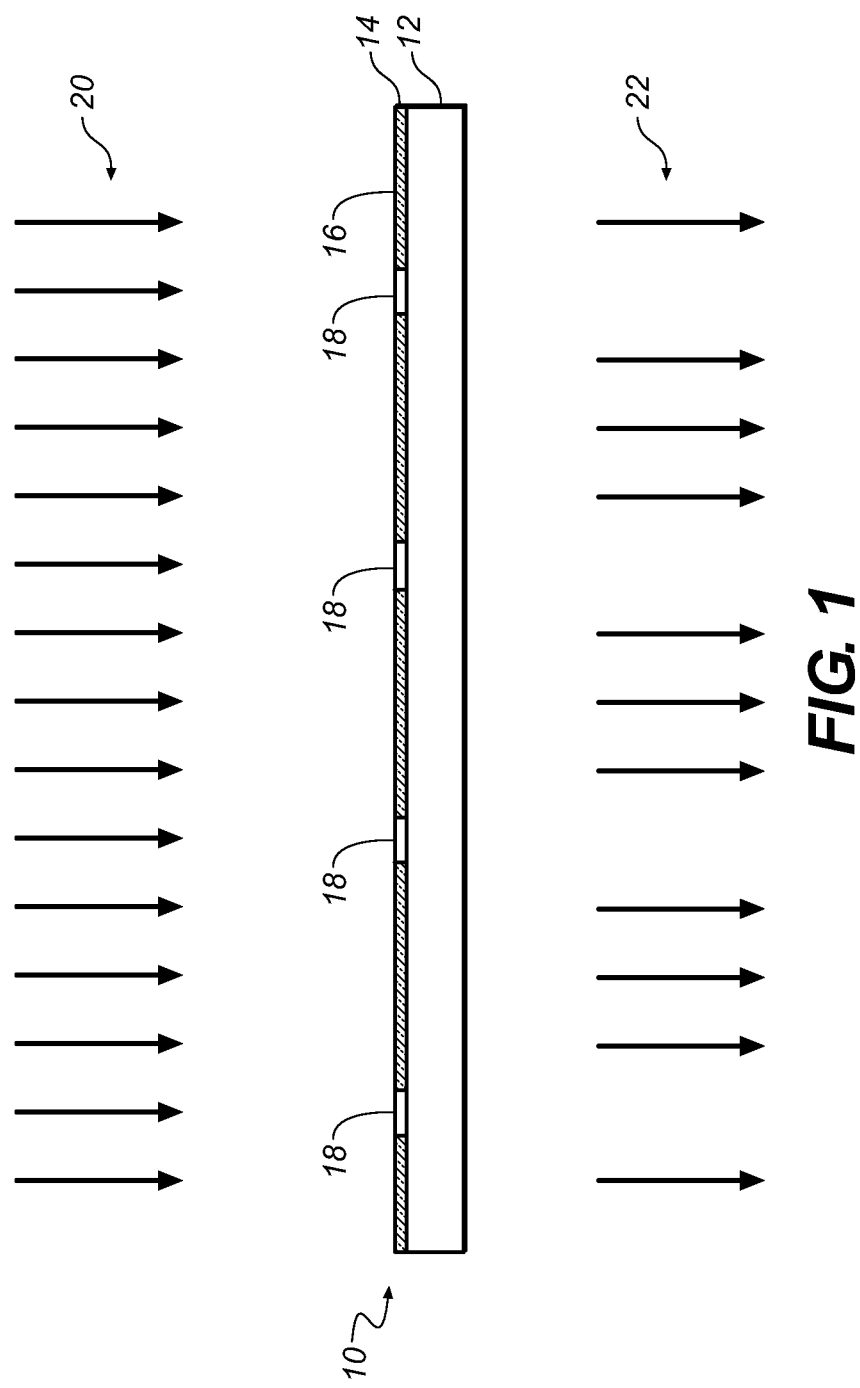
FIG. 1 is a cross-section view of a grid pattern according to the present invention.

The present invention will be directed in particular to elements forming part of, or in cooperation more directly with the apparatus in accordance with the present invention. It is to be understood that elements not specifically shown or described may take various forms well known to those skilled in the art.

DEFINITIONS

As used herein to define various components of the laser-engraveable compositions, formulations, and layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The substrate upon which a silver salt can be coated depends upon the intended utility and can be any substrate on which a conductive film or grid is desired. It may be rigid or flexible, opaque or transparent, depending upon the use. For example, the support substrate can be a transparent, flexible substrate. Such suitable substrates include, but are not limited to, glass, glass-reinforced epoxy laminates, cellulose triacetate, acrylic esters, polycarbonates, adhesive-coated polymer substrates, polymer substrates, and composite materials. Suitable polymers for use as polymer substrates include polyethylenes, especially polyethylene terephthalate (PET) and polyethylene naphthalate (PEN), polypropylenes, polyvinyl acetates, polyurethanes, polyesters, polyamides, polyimides, polysulfones, and mixtures thereof. The substrate, especially a polymer substrate, can be treated to improve adhesion of a silver salt emulsion or dispersion to one or both surfaces of the substrate. For example, the substrate can be coated with a polymer adhesive layer or one or both surfaces can be chemically treated or subjected to a corona treatment.

For coating onto a substrate in the manufacture of flexible electronic devices or components, the support can be flexible, which aids rapid roll-to-roll application. An Estar® PET film and a cellulose triacetate film are useful examples of flexible transparent substrates.

Alternatively, the substrate can be the same support used in a flexible display device, by which it is meant that a silver salt layer can be coated onto a support designed for a display device and imaged in situ according to a desired pattern, and then processed in situ.

Where a discrete substrate is utilized (that is, the substrate is not the reverse side of a support in a flexible display device), it can be coated with a silver salt layer on either side or both sides. If different patterns are intended for each side, the substrate or intervening layers of absorber dyes can be provided to prevent light exposure from one side reaching the other. Alternatively, the silver salts can be sensitized differently for each side of the substrate.

The silver salt can be any material that is capable of providing a latent image (that is, a germ or nucleus of metal in each exposed grain of metal salt) according to a desired pattern upon photo-exposure or thermal exposure. The latent image can then be developed into a metal image.

For example, the silver salt can be a photosensitive silver salt such as a silver halide or mixture of silver halides. The silver halide may be, for example, silver chloride, silver bromide, silver chlorobromide, or silver bromoiodide. In one useful embodiment, the silver halide dispersion (or emulsion as it can be called) is dispersed in a binder as a high contrast silver halide emulsion, which is suitable, for example, in the graphic arts and in manufacturing printed circuit boards (PCBs). One such high contrast silver halide emulsion is a silver chlorobromide emulsion, for example comprising at least 50 mol % silver chloride, typically at least 60 mol % and up to and including 90 mol % silver chloride, or more likely at least 60 mol % and up to and including 80 mol % silver chloride. The remainder of the silver halide can be substantially silver bromide.

Generally, the silver salt layer comprises one or more hydrophilic binders or colloids. Non-limiting examples of such hydrophilic binders or colloids include but are not limited to hydrophilic colloids such as gelatin or gelatin derivatives, polyvinyl alcohol (PVA), polyvinylpyrrolidone (PVP), casein, and mixtures thereof. Suitable hydrophilic colloids and vinyl polymers and copolymers are also described in Section IX of *Research Disclosure* Item 36544, September 1994 that is published by Kenneth Mason Publications, Emsworth, Hants, PO10 7DQ, UK, and that is incorporated herein by reference for the portions that are relevant to silver halide photochemistry. A particular hydrophilic colloid is gelatin.

In many embodiments, the binder in the silver salt layer (or any other layer) includes one or more hardeners designed to harden the particular binder such as gelatin. Particularly useful hardeners include but are not limited to, non-polymeric vinyl-sulfones such as bis(vinyl-sulfonyl) methane (BVSM), bis(vinyl-sulfonyl methyl) ether (BVSME), and 1,2-bis(vinyl-sulfonyl acetoamide)ethane (BVSAE). Mixtures of hardeners can be used if desired.

One useful photosensitive silver salt composition is a high metal (for example, silver)/low binder (for example, gelatin) composition, that after silver salt development, is sufficiently conductive. Where the photosensitive silver salt layer comprises an emulsion of silver halide dispersed in gelatin, a particularly useful weight ratio of silver to gelatin is 1.5:1 or higher in the silver salt layer. In certain embodiments, a ratio between 2:1 and 3:1 in the silver salt layer is particularly useful.

According to many embodiments, the useful silver salt is a silver halide that is sensitized to any suitable wavelength of exposing radiation. Organic sensitizing dyes can be used, but it can be advantageous to sensitize the silver salt in the UV portion of the electromagnetic spectrum without using sensitizing dyes. This avoids unwanted dye stains if the conductive film element is intended to be transparent.

Non-limiting examples of silver halide emulsions including addenda and hydrophilic binders that can be used in the present invention are described in *Research Disclosure* Item 36544, September 1994. Other useful silver salt emulsions are also described, for example in U.S. Pat. No. 7,351,523 (Grzeskowiak); U.S. Pat. Nos. 5,589,318 and 5,512,415 (both to Dale et al.), all of which are incorporated herein by reference.

Useful silver halide emulsions can be prepared by any suitable method of grain growth, for example, by using a balanced double run of silver nitrate and salt solutions using a feedback system designed to maintain the silver ion concentration in the growth reactor. Dopants can be introduced uniformly from start to finish of precipitation or can be structured into regions or bands within the silver halide grains. Dopants, for example osmium dopants, ruthenium dopants, iron dopants, rhenium dopants, iridium dopants, or cyanoruthenate dopants, can be added. A combination of osmium and iridium dopants such as osmium nitrosyl pentachloride, is useful. Such complexes can be alternatively utilized as grain surface modifiers in the manner described in U.S. Pat. No. 5,385,817 (Bell). Chemical sensitization may be carried out by any of the known silver halide chemical sensitization methods, for example using thiosulfate or another labile sulfur compound, or in combination with gold complexes.

The silver halide grains can be cubic, octahedral, rounded octahedral, polymorphic, tabular, or thin tabular emulsion grains. Such silver halide grains can be regular untwinned, regular twinned, or irregular twinned with cubic or octahedral faces. In one embodiment, the silver halide grains are cubic having an edge length of less than 0.5 μm, or less than 0.25 μm, or at least 0.05 μm.

Specific references relating to the preparation of emulsions of differing halide ratios and morphologies are U.S. Pat. No. 3,622,318 (Evans); U.S. Pat. No. 4,269,927 (Atwell); U.S. Pat. No. 4,414,306 (Wey et al.); U.S. Pat. No. 4,400,463 (Maskasky); U.S. Pat. No. 4,713,323 (Maskasky); U.S. Pat. No. 4,804,621 (Tufano et al.); U.S. Pat. No. 4,783,398 (Takada et al.); U.S. Pat. No. 4,952,491 (Nishikawa et al.); U.S. Pat. No. 4,983,508 (Ishiguro et al.); U.S. Pat. No. 4,820,624 (Hasebe et al.); U.S. Pat. No. 5,264,337 (Maskasky); U.S. Pat. No. 5,275,930 (Maskasky); U.S. Pat. No. 5,320,938 (House et al.); U.S. Pat. No. 5,550,013 (Chen et al.); U.S. Pat. No. 5,726,005 (Chen et al.); and U.S. Pat. No. 5,736,310 (Chen et al.); all of which are incorporated herein by reference.

Antifoggants and stabilizers can be added to give the silver halide emulsion the desired sensitivity, if appropriate. Antifoggants that can be used include, for example, azaindenes such as tetraazaindenes, tetrazoles, benzotriazoles, imidazoles and benzimidazoles. Specific antifoggants that can be used include 5-carboxy-2-methylthio-4-hydroxy-6-methyl-1,3,3a,7-tetraazaindene, 1-(3-acetamidophenyl)-5-mercaptotetrazole, 6-nitrobenzimidazole, 2-methylbenzimidazole, and benzotriazole, individually or in combination.

Nucleators and development boosters can be used to give ultra-high contrast. For example, combinations of hydrazine nucleators such as those disclosed in U.S. Pat. No. 6,573,021 (Baker et al.), or hydrazine nucleators disclosed in U.S. Pat. No. 5,512,415 (Dale et al.) (col. 4, line 42 to col. 7, line 26) can be used, both references that are incorporated herein by reference. Booster compounds that can be present include amine boosters that comprise at least one secondary or tertiary amino group and have an n-octanol/water partition coefficient (log P) of at least 1, for example of at least 3. Suitable amine boosters include those described in U.S. Pat. No. 5,512,415 (col. 7, line 27 to col. 8, line 16). Useful boosters include bis-tertiary amines and bis-secondary amines, such as compounds having dipropylamino groups linked by a chain of hydroxypropyl units, such as those described in U.S. Pat. No. 6,573,021. Any nucleator or booster compound utilized can be incorporated into the silver halide emulsion, or alternatively can be present in a hydrophilic colloid layer that is adjacent the layer containing the silver halide emulsion for which the effects of the nucleator are intended.

In addition to the layer(s) containing the silver salt, the conductive film element can include other layers such as overcoat layers, light absorbing filter layers, adhesion layers, and other layers as are known in the art. For example, light absorbing filter layers can include one or more filter dyes that absorb in the UV, red, green, or blue regions of the electromagnetic spectrum, or any combination thereof.

In embodiments wherein a silver salt layer is provided on both sides of the substrate and is exposed with radiation of a particular wavelength, it is useful to provide a light absorbing filter layer comprising a filter dye between the silver salt layer and the substrate wherein the filter dye absorbs the chosen exposing radiation. Both sides can optionally comprise this light absorbing filter layer.

In certain useful embodiments, the silver coverage in the conductive film element precursor is at least 2000 mg/m$^2$ and the silver to gelatin weight ratio in the silver salt layer is at least 1.5:1. When a silver metal grid is formed, such conditions result in silver lines that are significantly raised relative to the non-imaged gelatin background. When the silver metal is 4000 mg/m$^2$ or more, the effect is quite pronounced. In a cross-sectional view of a conductive film element, the silver grid lines have the appearance of drawing up binder (for example, gelatin) at the base of the silver lines in a curved fashion. When it is desired to make a "transparent conductive film element" (greater than 50% light transmission to visible light) using thin grid lines of silver metal (for example, each silver metal line less than 10 μm wide), the gelatin profile adjacent to the silver metal grid lines can cause optical effects that reduce the overall transparency and cause haze and image distortion.

It is therefore useful to apply a planarizing layer over the silver grid structure that has an index of refraction close to that of the binder. The planarizing layer can comprise the same or different binder material used in forming the conductive silver element precursor. It can be a curable resist or an optical adhesive. It can be coated by ink jet, spray coating, curtain coating, roll coating, or other coating method known in the art. In a useful embodiment, the planarizing layer can be an optical adhesive that is coated on a separate substrate that is laminated to the silver metal grid, typically by the application of heat and pressure.

When the conductive film element comprises a binder overcoat and electrical contact is desired, it is useful for electrical connections to include a structure that can penetrate the binder overcoat and reach the underlying conductive silver metal grid.

Numerous developing solutions (identified herein also as "developer") are known that can develop the exposed silver salts described above to form silver metal, for example in the form of a grid pattern. It has been found, however, that commercially available developers do not necessarily provide conductivity across the grid pattern that is desired. In many cases, the developers provide no measurable conductivity, even though there may be a visible image. One developer that yielded some conductivity is Accumax® silver halide developer when used to process exposed silver chlorobromide based films such as those used in graphic arts. However, it does not provide needed for certain uses. The examples described below demonstrate useful developers that can convert a silver salt to silver metal and then provide improved conductivity.

Developers are generally aqueous solutions comprising one or more silver salt (such as a silver halide) developing agents, of the same or different type, including but not limited to, polyhydroxybenzenes (such as dihydroxybenzene, or in its form as hydroquinone), aminophenols, p-phenylenediamines, ascorbic acid and its derivatives, reductones, erythorbic acid and its derivatives, pyrazolidone, pyrazolone, pyrimidine, dithionite, and hydroxylamines. One or more developing agents can be present in an amount of at least 0.005 mol/l and up to and including 2 mol/l, or typically in an amount of at least 0.05 mol/l and up to and including 0.5 mol/l.

The developers can also include auxiliary silver developing agents that exhibit super-additive properties with a developing agent. Such auxiliary developing agents can include but are not limited to, Elon and substituted or unsubstituted phinedones, in an amount of at least 0.0001 mol/l and up to and including 0.02 mol/l, or typically in an amount of at least 0.001 mol/l and up to and including 0.005 mol/l.

Useful developers can also include one or more silver complexing agents (or silver ligands) including but not limited to, sulfite, thiocyanate, thiosulfate, thiourea, thiosemicarbazide, tertiary phosphines, thioethers, amines, thiols, aminocarboxylates, triazolium thiolates, pyridines (including bipyridine), imidazoles, and aminophosphonates. The useful amount of one or more silver complexing agents is at least 0.05 g/l and up to and including 2.0 g/l.

Other addenda that can be present in the developers in amounts that would be readily known by one skilled in the art, include but are not limited to, metal chelating agents, antioxidants, small amounts of water-miscible organic solvents (such as benzyl alcohol and diethylene glycol), nucleators, and acids, bases, and buffers (such as carbonate, borax and other basic salts) to establish a pH of at least 8 and generally of a pH of at least 9.5.

Useful developer temperatures can range from at least 15° C. and up to and including 50° C., and more typically from at least 25° C. and up to and including 40° C. Useful development times are in a range from at least 10 seconds and up to and including 10 minutes, and typically from at least 20 seconds and up to and including 5 minutes.

After development, the undeveloped silver salt is removed by treating the developed film with a fixing solution. Fixing solutions are well known in the art and contain compounds that complex the silver salt in order to dissolve undeveloped silver out of the binder. Thiosulfate salts are commonly used in fixing solutions. The developed film can be processed in a fixing solution immediately after development, or there can be an intervening stop bath or water wash or both. As well known in the art, a stop bath typically contains a dilute acid such as acetic or sulfuric acid. The pH is typically less than 5 and the stops development. After fixing, the film can be washed in water which can optionally include surfactants or other materials to reduce water spot formation upon drying. Drying can be conducted simply by drying in air or by heating, for example, in a convection oven. To improve conductivity, heating at a temperature above 80 C but below the Tg of the support, can optionally be performed.

After fixing, the film can optionally be treated to enhance conductivity such with electroless plating solutions or solutions disclosed in U.S. Pat. No. 3,223,525 (Hendrik).

"Selectively heating by electromagnetic radiation" refers to radiation used to anneal the silver pattern after it is developed and is distinct from radiation used to image the conductive element precursor.

"Selectively absorbed primarily by the silver pattern" means that other coated components absorb less than 20%, preferably less than 5%, of the amount of electromagnetic radiation relative to the absorption by the silver pattern.

"Substantially transparent to the electromagnetic radiation" means that the substrate, binder and optional other components in the binder collectively absorb less than 10%, and preferably less than 5%, of the electromagnetic radiation.

Figure 2:
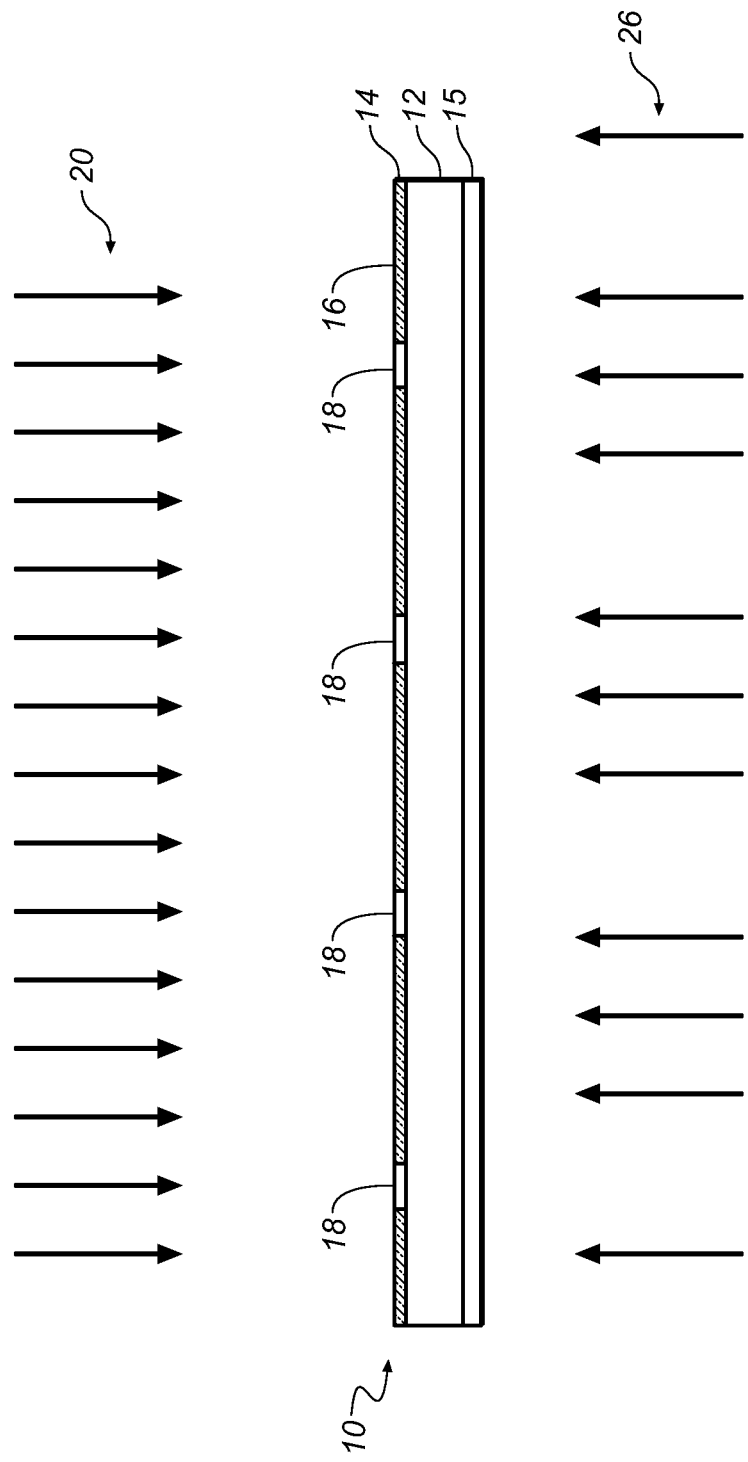
FIG. 2 is a cross-section view of a substrate with a grid pattern on both sides of the substrate.

Referring to FIGS. 1 and 2, a conductive film grid 10 is shown. Film grid 10 has a layer of binder with a grid pattern 14 on a substrate or film support 12. Layer 14 is comprised of developed silver pattern in a binder 18 and substantially transparent regions of binder 16. According to one aspect of the present invention layer 14 is formed from a photographic silver salt and the grid a pattern of parallel lines by coating a silver salt in a binder on a substrate.

The developed silver pattern in a binder 18 is selectively heated with electromagnetic radiation 20. The electromagnetic radiation is selected from, but not limited to, a group consisting of microwave, infrared, visible and ultraviolet radiation. The electromagnetic radiation may be scanned or applied globally and in a uniform or non-uniform manner. The electromagnetic radiation is selectively absorbed primarily by the silver pattern and not by the transparent regions of binder.

The substrate and binder are substantially transparent to the electromagnetic radiation and the binder may include other components that are also substantially transparent to the electromagnetic radiation. The electromagnetic radiation selectively heats the silver pattern causing removal or moving of at least some binder in the vicinity of the silver pattern. This favorably improves conductivity by reducing the amount of binder present between particles of developed silver thereby allowing better contact between silver particles in the pattern. Electromagnetic radiation 22 is radiation that has passed through the substantially transparent regions. As radiation is not substantially absorbed by the transparent regions of the binder, these regions do not heat significantly and are not damaged. High temperatures as found, for example, in a high temperature oven, can cause damage or discoloration of binder.

When applying the electromagnetic radiation, it can be advantageous to provide a larger exposure dose in a fine-line or grid area relative to large-area features, such as silver contact pads. For example, in one embodiment, contact pads were protected from the blanket IR exposure by paper or tape to prevent the PET substrate from warping.

FIG. 2 shows binder with a grid pattern 15 on a second surface of the film support 12. The binder with a grid pattern of 15 on the second surface may be different in chemical composition and the form of the pattern. The binder with developed silver pattern 15 is selectively heated with electromagnetic radiation 26, which may or may not be the same wavelength or intensity as electromagnetic radiation 20 used for heating conductive film grid 10.

Figure 3:
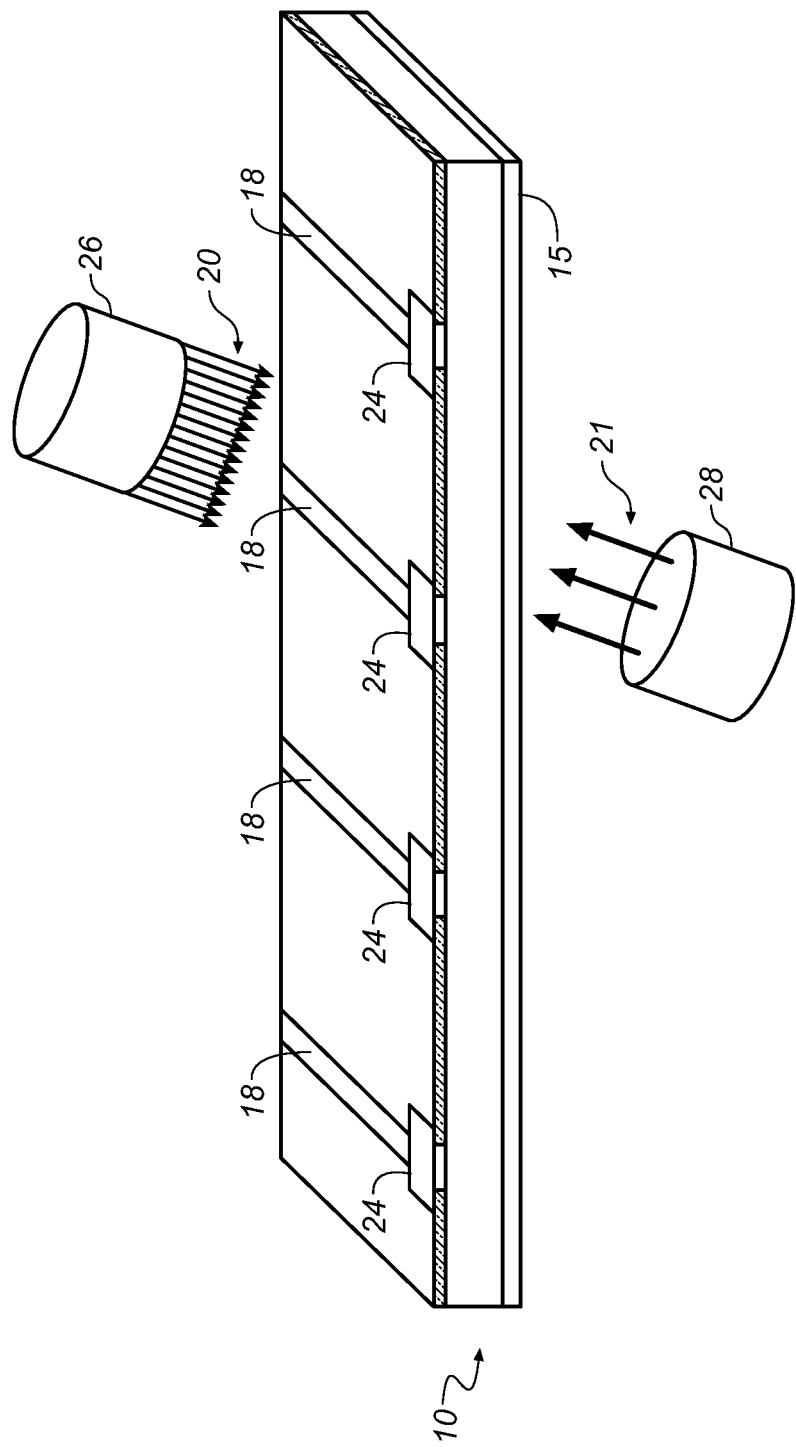
FIG. 3 is a perspective view of the embodiment shown in FIG. 2.

Referring to FIG. 3, grid pattern 14 is show in parallel lines in one embodiment. The width of the lines and the spacing between the lines will be determined by requirements of conductivity and transparency. Gridlines 15 are, in one embodiment, parallel gridlines which run perpendicular to gridlines 14.

Selective heating of the first and second silver patterns may be in with a first laser 26 and second laser 28. Other sources of radiation which are known in the art may be substituted for the lasers. Electromagnetic radiation 20 and electromagnetic radiation 21 may be applied sequentially or simultaneously as described above.

Paper or tape 24 or other suitable material, covers silver contact pads (not shown), which connect the grid pattern 14 to an electrical circuit (not shown). Covering the contact pads during heating with the radiation has been shown to reduce curling and distortion at the edges of the conductive film grid 10. The paper or tape 24 covers electrical contacts on at least one edge of the coated substrate.

The silver metal is selectively heated using a laser, an area-illumination source, or a flash lamp providing infrared photonic energy. Heating may also be accomplished with an Infrared Diode Laser Array with a typical exposure time 10 to 25 microseconds.

Treatment in the range of 0.2 to 0.5 J/cm$^2$ resulted in:
little or no color change,
line broadening of 0-1 microns per edge,
resistance drops to 90%-25% of initial value depending on sample, and
samples with best resistance improve the least.
Treatment in the range of 1.0 to 2.0 J/cm$^2$ resulted in:
color changes from black to silver,
smoke given off as the gelatin decomposes,
delamination of large solid contacts,
resistance dropping to 30% to 1% of initial value, and
lines broaden by up to 3.5 microns per edge.
The samples with best resistance improved the least.
When infrared lamp heating was at 400-800 mW/cm$^2$:
there was no color change,
resistance dropped to 90 to 75% of initial value for certain samples (initially <120 ohm/square),
1-2 minutes was required to reach steady state,
best flatness was maintained when samples were sandwiched between quartz plates, and
best resistance improvement was observed when the film was self supporting (with air contact at both surfaces).

The invention has been described in detail with particular reference to certain preferred embodiments thereof, but it will be understood that variations and modifications can be effected within the scope of the invention.

PARTS LIST 10 conductive film grid
12 film support
14 binder with grid pattern
15 binder with grid pattern
16 clear region of binder
18 binder with developed silver grains
20 electromagnetic radiation for selective heating
21 electromagnetic radiation for selective heating
22 transmitted electromagnetic radiation
24 paper or tape
26 laser or radiation source
28 laser or radiation source

The invention claimed is:

1. A method of improving conductivity of a metal pattern comprising:
   providing a developed silver pattern formed from a photographic silver salt provided in a binder coated on a substrate; and
   increasing conductivity of the silver pattern by heating the silver pattern with electromagnetic radiation to anneal the silver pattern.

2. The method of claim 1 wherein the electromagnetic radiation is selected from a group consisting of microwave, infrared, visible and ultraviolet.

3. The method of claim 1 wherein the electromagnetic radiation is scanned or applied globally.

4. The method of claim 1 wherein the electromagnetic radiation is applied uniformly.

5. The method of claim 1 wherein the electromagnetic radiation is selectively absorbed primarily by the silver pattern.

6. The method of claim 1 wherein the substrate and binder are substantially transparent to the electromagnetic radiation.

7. The method of claim 6 wherein the binder includes other components that are also substantially transparent to the electromagnetic radiation.

8. The method of claim 1 wherein the electromagnetic radiation selectively removes binder in the vicinity of the silver pattern.

9. The method of claim 1 wherein paper or tape covers electrical contacts on at least one edge of the coated substrate.

10. The method of claim 1 wherein the pattern includes a grid of conductive lines and conductive pads.

11. The method of claim 10 wherein the conductive pads receive less exposure to electromagnetic radiation than the conductive lines.

12. A method of making a conductive metal pattern comprising:
- coating a silver salt in a binder on a substrate;
- imaging the silver salt and binder to produce a silver pattern;
- developing the silver pattern; and
- annealing the silver pattern by exposing the silver pattern with electromagnetic radiation to increase the conductivity of the silver pattern.

13. A method of making a capacitive touchscreen comprising:
- providing a substrate;
- coating a silver salt in a binder on a first side of the substrate;
- coating a silver salt in a binder on a second side of the substrate;
- imaging the silver salt and binder on the first side of the substrate to produce a first silver pattern;
- imaging the silver salt and binder on the second side of the substrate on the second side of the substrate to produce a second silver pattern;
- developing the first and second silver pattern; and
- heating the first and second silver patterns with electromagnetic radiation to remove binder in the vicinity of the silver pattern and increase conductivity of the silver pattern.

* * * * *